United States Patent
Boniardi et al.

(10) Patent No.: US 9,312,481 B2
(45) Date of Patent: Apr. 12, 2016

(54) MEMORY ARRAYS AND METHODS OF FORMING MEMORY ARRAYS

(71) Applicant: Micron Technology, Inc., Boise, ID (US)

(72) Inventors: Mattia Boniardi, Cormano (IT); Andrea Redaelli, Casatenovo (IT)

(73) Assignee: Micron Technology, Inc., Boise, ID (US)

( * ) Notice: Subject to any disclaimer, the term of this patent is extended or adjusted under 35 U.S.C. 154(b) by 80 days.

(21) Appl. No.: 14/226,643

(22) Filed: Mar. 26, 2014

(65) Prior Publication Data

US 2015/0280117 A1    Oct. 1, 2015

(51) Int. Cl.
  *H01L 45/00* (2006.01)
  *H01L 27/24* (2006.01)

(52) U.S. Cl.
  CPC .......... *H01L 45/128* (2013.01); *H01L 27/2463* (2013.01); *H01L 45/126* (2013.01); *H01L 45/1608* (2013.01)

(58) Field of Classification Search
  None
  See application file for complete search history.

(56) References Cited

U.S. PATENT DOCUMENTS

| | | | |
|---|---|---|---|
| 6,579,760 B1 * | 6/2003 | Lung | 438/257 |
| 2006/0226409 A1 | 10/2006 | Burr et al. | |
| 2007/0181932 A1 * | 8/2007 | Happ | H01L 27/2436 257/314 |
| 2007/0274121 A1 * | 11/2007 | Lung et al. | 365/148 |
| 2011/0057161 A1 | 3/2011 | Sandhu et al. | |
| 2013/0026436 A1 | 1/2013 | Breitwisch et al. | |
| 2013/0087756 A1 | 4/2013 | Joseph et al. | |
| 2013/0313504 A1 * | 11/2013 | Park | 257/4 |

FOREIGN PATENT DOCUMENTS

WO  PCT/US2014/072584    3/2015

* cited by examiner

*Primary Examiner* — Bilkis Jahan
*Assistant Examiner* — Kevin Quinto
(74) *Attorney, Agent, or Firm* — Wells St. John P.S.

(57) ABSTRACT

Some embodiments include memory arrays having a plurality of memory cells vertically between bitlines and wordlines. The memory cells contain phase change material. Heat shields are laterally between immediately adjacent memory cells along a bitline direction. The heat shields contain electrically conductive material and are electrically connected with the bitlines. Some embodiments include memory arrays having a plurality of memory cells arranged in a first grid. The first grid has columns along a first direction and has rows along a second direction substantially orthogonal to the first direction. First heat shields are between adjacent memory cells along the first direction and are arranged in a second grid offset from the first grid along the first direction. Second heat shields are between adjacent memory cells along the second direction, and are arranged lines in lines extending along the first direction. Some embodiments include methods for forming memory arrays.

22 Claims, 14 Drawing Sheets

MEMORY ARRAYS AND METHODS OF FORMING MEMORY ARRAYS

TECHNICAL FIELD

Memory arrays and methods of forming memory arrays.

BACKGROUND

Memory is one type of integrated circuitry, and is used in electronic systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

One type of memory is phase change memory (PCM). Such memory utilizes phase change material as a programmable material. Example phase change materials that may be utilized in PCM are chalcogenide materials.

The phase change material reversibly transforms from one phase to another through application of appropriate stimulus. Each phase may be utilized as a memory state, and thus an individual PCM cell may have two selectable memory states that correspond to two inducible phases of the phase change material.

A difficulty that may be encountered during utilization of PCM is described with reference to FIGS. 1 and 2. FIG. 1 shows a portion of a construction 10 comprising a PCM array. The array comprises memory cells 12-14, with each memory cell comprising phase change material 15. The phase change material is provided between a heater material 16 and an electrically conductive capping material 18. A bitline 20 extends across the memory cells 12-14, and is electrically coupled to the memory cells through the capping material 18. The memory cells are also electrically coupled to wordlines 22-24 that extend under the memory cells.

The illustrated memory cells 12-14 may be along a single column of the memory array, and accordingly are connected to a common bitline.

The wordlines may extend in and out of the page relative to the cross-sectional view of FIG. 1, and may connect the illustrated memory cells with other memory cells (not shown) along rows of the memory array.

Electrically insulative material 26 is provided between the memory cells. The electrically insulative material may comprise a single composition (as shown), or may comprise multiple different compositions.

Referring to FIG. 2, memory cell 13 may be selectively programmed through appropriate electrical stimulus along bitline 20 and wordline 23. Such programming may involve utilizing heater material 16 to raise a temperature of programmable material 15 to at least about a transition temperature suitable to alter crystallinity within material 15. Such temperature raise creates a region 28 within the programmable material of memory cell 13 having altered physical properties, and thus transitions the memory cell to a different memory state than the adjacent memory cells 12 and 14.

A problem that may occur during the programming of memory cell 13 is thermal crosstalk between memory cell 13 and the adjacent memory cells 12 and 14. Arrows 29 are provided to diagrammatically illustrate thermal energy migrating outwardly from memory cell 13 during the programming of such memory cell. The thermal crosstalk may cause a so-called "program-disturb" phenomena in which data is lost from a memory cell during programming of a neighboring memory cell.

It would be desirable to alleviate or prevent thermal crosstalk between neighboring memory cells of PCM arrays.

DETAILED DESCRIPTION OF THE ILLUSTRATED EMBODIMENTS

Some embodiments include methods of forming heat shields (i.e., thermal sinks) between adjacent PCM cells to alleviate or prevent the thermal crosstalk problem described above in the "Background" section. Example embodiments are described below with reference to FIGS. 3-15.

Figure 1:
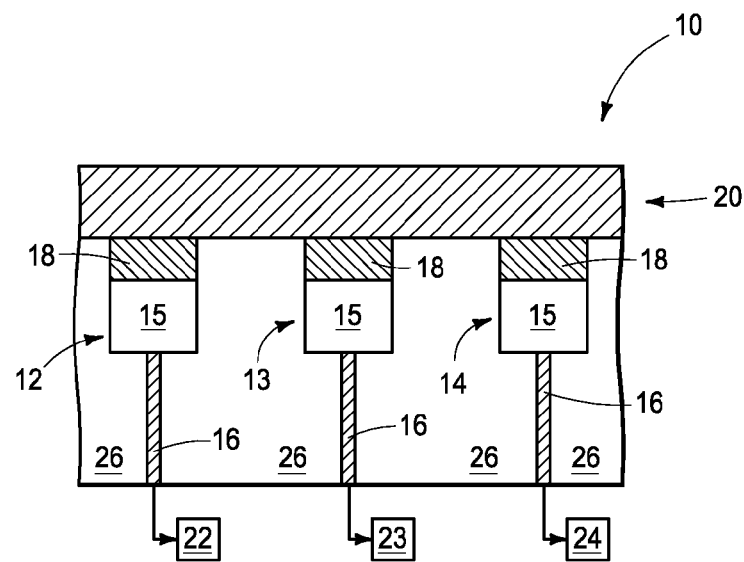
FIGS. 1 and 2 are diagrammatic cross-sectional views of a region of a prior art memory array illustrating a prior art problem.
Figure 2:
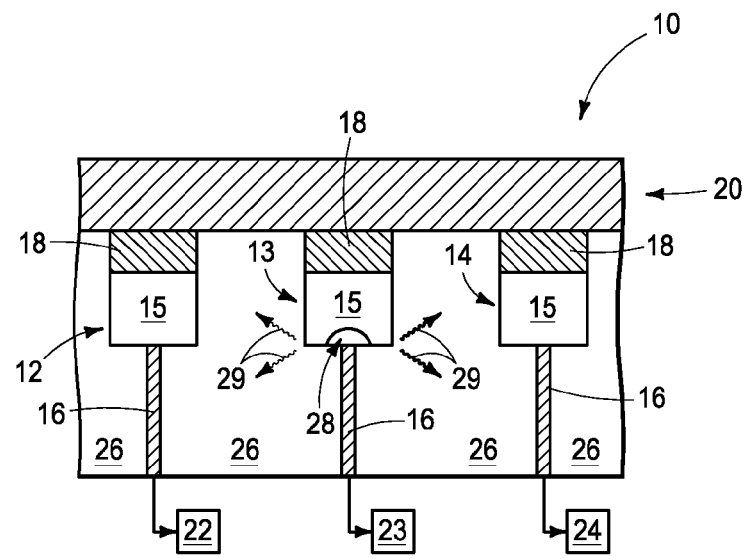
Figure 3:
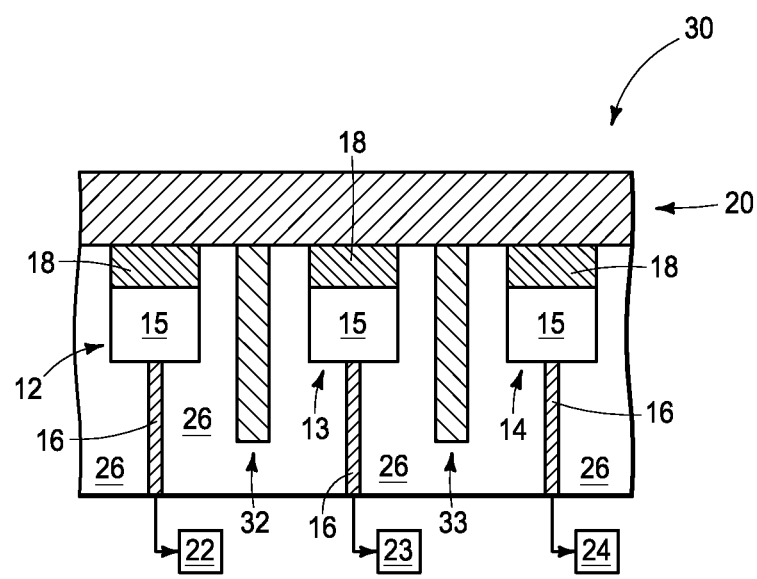
FIG. 3 is a diagrammatic cross-sectional view of a region of an example embodiment memory array.

Referring to FIG. 3, a construction 30 is shown comprising similar structures and devices as were shown and described with reference to prior art FIG. 1. However, construction 30 also comprises heat shields 32 and 33 provided between neighboring memory cells. Specifically, heat shield 32 is provided between neighboring cells 12 and 13, and heat shield 33 is provided between cells 13 and 14. The heat shields 32 and 33 are electrically conductive, and are electrically coupled to bitline 20. The heat shields may comprise metal, and may be compositionally different from bitline 20 (as shown), or may comprise a material in common with a region of the bitline (as described below with reference to FIG. 13).

The heat shields 32 and 33 of FIG. 3 are between memory cells along a bitline direction (specifically, along the direction of bitline 20). In other embodiments, additional heat shields may be provided along wordline directions, as described below with reference to FIGS. 14 and 15.

Example memory arrays comprising heat shield configurations, and example methods of fabricating heat shield configurations within memory arrays, are described below with reference to FIGS. 4-15.

Figure 4:
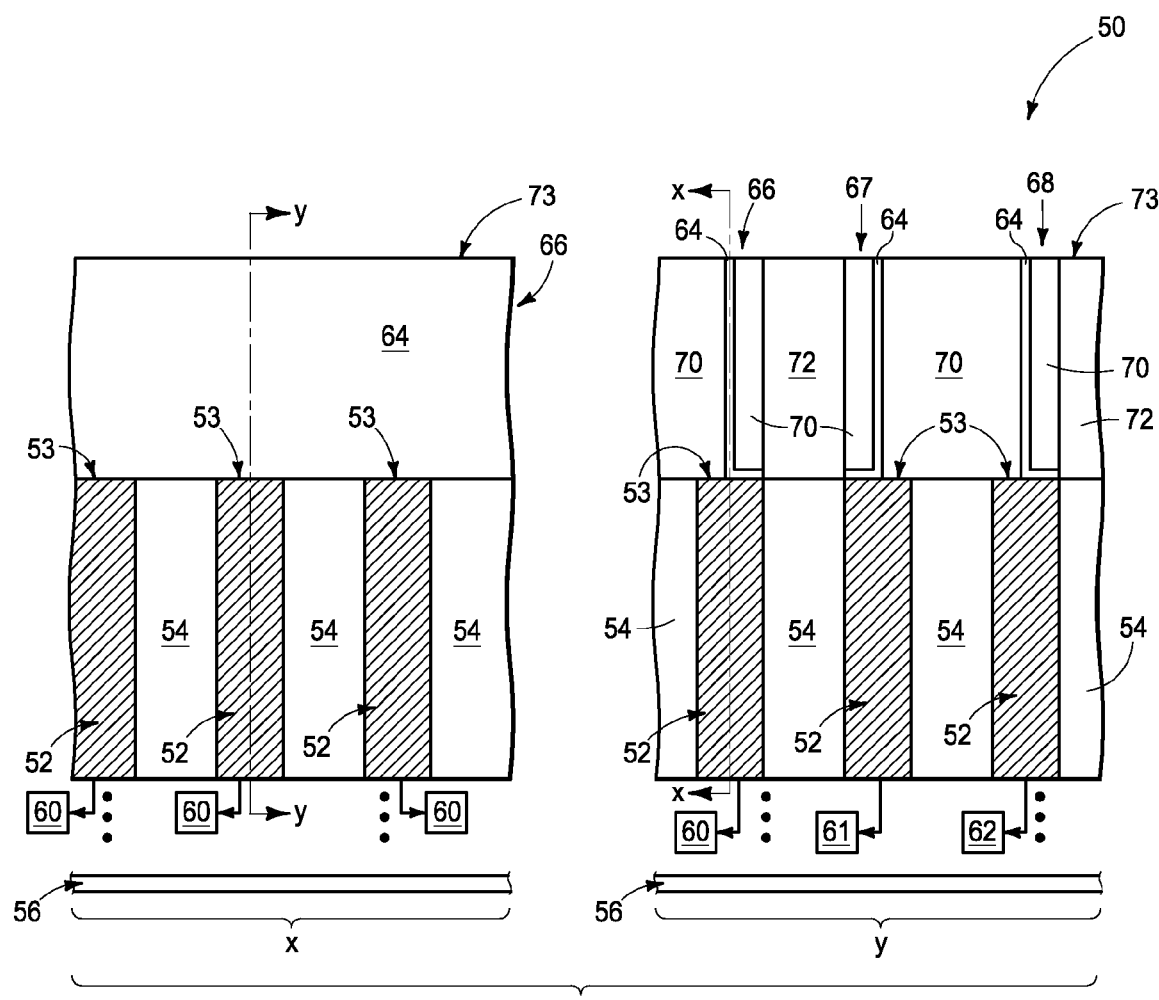
FIGS. 4-8 are diagrammatic cross-sectional view of regions of a semiconductor construction in accordance with an example embodiment process of forming an example embodiment memory array. Each of FIGS. 4-8 illustrates a cross-section along an x-direction and a cross-section along a y-direction; with the x-direction cross-section being along the line x-x through the y-direction cross-section, and with the y-direction cross-section being along the line y-y through the x-direction cross-section.

Referring to FIG. 4, a semiconductor construction 50 is illustrated along two orthogonal cross-sections, with one of the cross-sections being labeled "x" and the other "y". The "x" cross-section is along the line x-x of the "y" cross-section, and the "y" cross-section is along the line y-y of the "x" cross-section.

The semiconductor construction includes a plurality of interconnects 52. Such interconnects are electrically conductive, and may comprise any suitable material; including, for example, one or more of various metals (for instance, tungsten, titanium, etc.), metal-containing compositions (for instance, metal silicide, metal carbide, etc.) and conductively-doped semiconductor materials (for instance, conductively-doped silicon, conductively-doped germanium, etc.). In some specific examples, the interconnects 52 may be part of, or coupled to, select devices which are utilized to control current through memory cells. For instance, the interconnects 52 may comprise metal silicide formed over a conductively-doped region of a bipolar junction transistor (BJT).

The interconnects 52 are spaced from one another by electrically insulative material 54. Such electrically insulative material may comprise any suitable composition or combination of compositions; including, for example, silicon nitride, silicon dioxide, etc.

The interconnects 52 and the electrically insulative material 54 are shown to be supported by a base 56. The base 56 may comprise semiconductor material, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Base 56 may correspond to a semiconductor substrate containing one or more materials associated with integrated circuit fabrication in some embodiments. Such materials may correspond to, for example, one or more of refractory metal materials, barrier materials, diffusion materials, insulator materials, etc. In the shown embodiment, the base is spaced from the interconnects 52 to indicate that other materials may be provided between the base and the interconnects. For instance, wordlines 60-62 may be under the interconnects 52, and electrically coupled to such interconnects (either directly, or through select devices). The wordlines may extend in and out of the page relative to the "y" direction, and accordingly may extend along the "x" direction (accordingly, all of the interconnects 52 are shown connected to a common wordline 60 along the x-direction).

The interconnects 52 may be configured as a grid having columns along the "y" direction and rows along the "x" direction. The interconnects have upper surfaces 53, and may have any suitable shapes. For instance, in some embodiments the interconnects may be cylindrical, and accordingly upper surfaces 53 may be circular when viewed from above. In other embodiments, upper surfaces 53 may be elliptical, polygonal, or any other suitable shape when viewed from above. For instance, in some embodiments the interconnects 52 may be square or rectangular columns, and accordingly upper surfaces 53 may have square or rectangular shapes when viewed from above.

In some embodiments, the upper surfaces 53 of the interconnects may be considered to correspond to an array of electrical nodes. Such array has a row direction along the illustrated "x" cross-section, and a column direction along the illustrated "y" cross-section; with the row direction being substantially orthogonal to the column direction. The term "substantially" is utilized to indicate that the row direction and column direction are orthogonal to one another within reasonable tolerances of fabrication and measurement.

Heater material 64 is formed over the interconnects 52, and in the shown embodiment is formed directly against the electrical nodes corresponding to upper surfaces 53. The heater material is configured as strips 66-68 extending along the row direction, and spaced from one another along the column direction. In the shown embodiment, the strips 66-68 correspond to angled plate structures comprising horizontal portions along upper surfaces 53, and vertical portions extending upwardly from the horizontal portions.

The heater material 64 may comprise any suitable composition or combination of compositions; including, for example, one or more of various compositions containing metal and nitrogen (for instance, WN, TiN, WCN, TiAlN, TiSiN, etc.; where the listed formulas provide primary components, rather than specifying specific stoichiometries).

Electrically insulative materials 70 and 72 are between the heater material strips 66-68. Such electrically insulative materials may comprise any suitable composition or combination of compositions. In some embodiments, electrically insulative material 70 may comprise silicon nitride, and electrically insulative material 72 may comprise silicon dioxide.

A planarized surface 73 is formed across materials 70, 72 and 64. Such planarized surface may be formed utilizing any suitable processing, including, for example, chemical-mechanical polishing (CMP).

The construction of FIG. 4 may be formed utilizing conventional processing.

Figure 5:
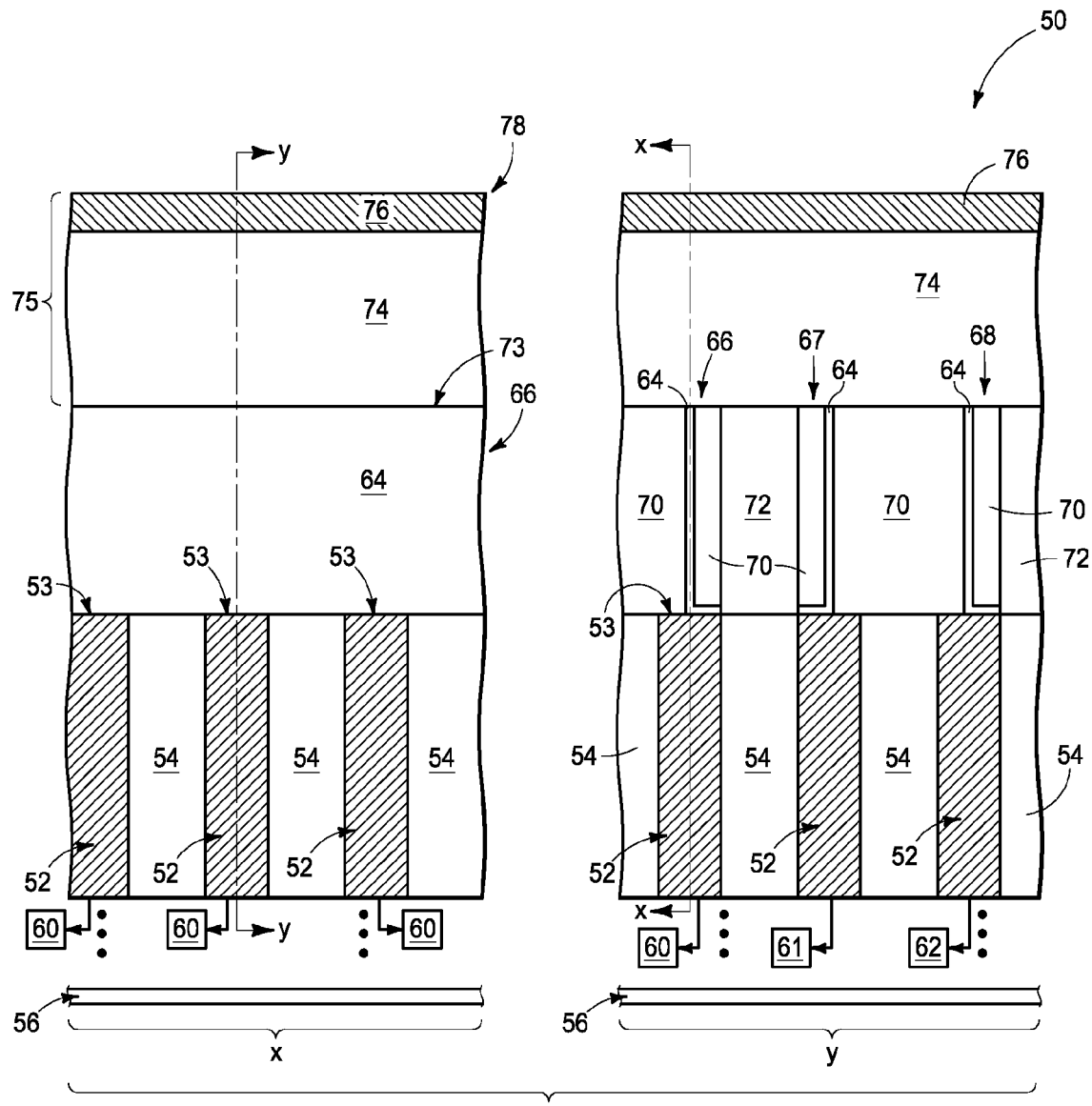

Referring to FIG. 5, a stack 75 is formed across planarized surface 73. The stack comprises phase change material 74 and electrically conductive capping material 76.

The phase change material 74 may comprise any suitable composition or combination of compositions; and in some embodiments may comprise, consist essentially of, or consist of a chalcogenide; such as, for example, a mixture of germanium, antimony and tellurium (i.e., a mixture commonly referred to as GST).

The electrically conductive capping material 76 may comprise any suitable composition or combination of compositions; and in some embodiments may comprise, consist essentially of, or consist of one or more of titanium, titanium nitride, tungsten, carbon, tantalum, tantalum nitride, etc.

Figure 6:
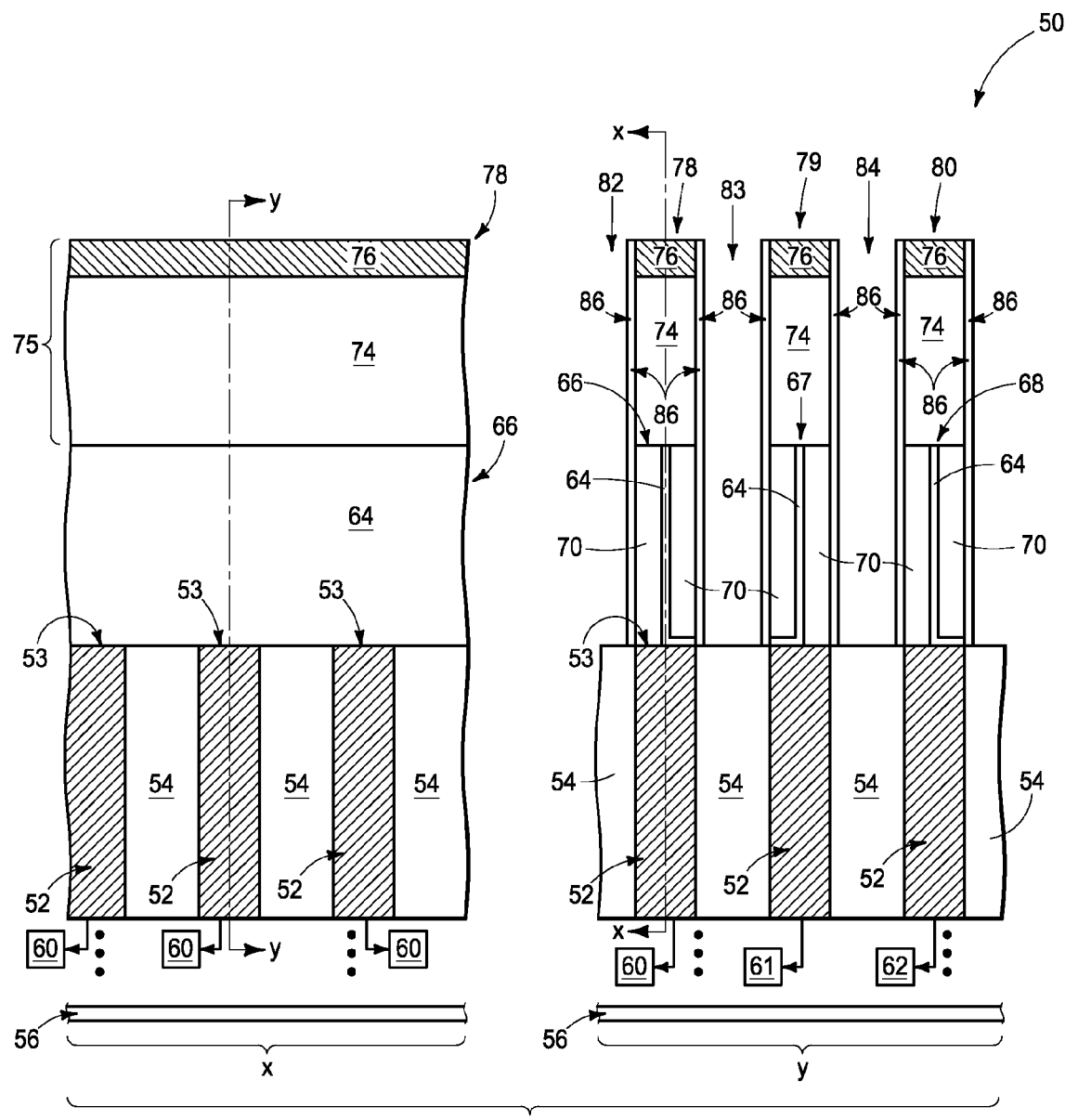

Referring to FIG. 6, stack 75 is patterned to form bands 78-80 in one-to-one correspondence with the heater material strips 66-68. The patterning of stack 75 may be accomplished with any suitable processing. For instance, a mask (not shown) may be provided over the stack to protect regions of the stack, while leaving other regions exposed; the exposed regions may be removed with one or more suitable etches; and then the mask removed to leave the construction of FIG. 6. The mask may be a lithographic mask (for instance, photo-lithographically-patterned photoresist); or a sub-lithographic mask (for instance, a mask formed utilizing pitch-multiplication methodologies); and in some example embodiments may be formed utilizing one or more of photolithography, pitch-multiplication, UV lithography, nano-imprinting, e-beam lithography, etc.

In the shown embodiment, the etching also penetrates through electrically insulative materials 70 and 72 (FIG. 5) to form trenches 82-84 extending to an upper surface of electrically insulative material 54. In some embodiments, the trenches may penetrate into the electrically insulative material 54, and accordingly may go deeper than heater material 64.

The bands 78-80 extend along the row direction (i.e., the x-direction of FIG. 6), and are spaced from one another along the column direction (i.e., the y-direction of FIG. 6).

Electrically insulative material liners 86 are formed along sidewalls of trenches 82-84. The electrically insulative material liners may comprise any suitable composition or combination of compositions; and in some embodiments may comprise, consist essentially of, or consist of silicon nitride. In some embodiments, the phase change material 74 may comprise oxygen-sensitive material, and it can be desired to utilize non-oxygen-containing liners to protect such phase change material 74 from oxidation. The liners 86 may be formed with any suitable processing, including, for example, deposition of a thin layer of appropriate material followed by anisotropic etching.

Figure 7:
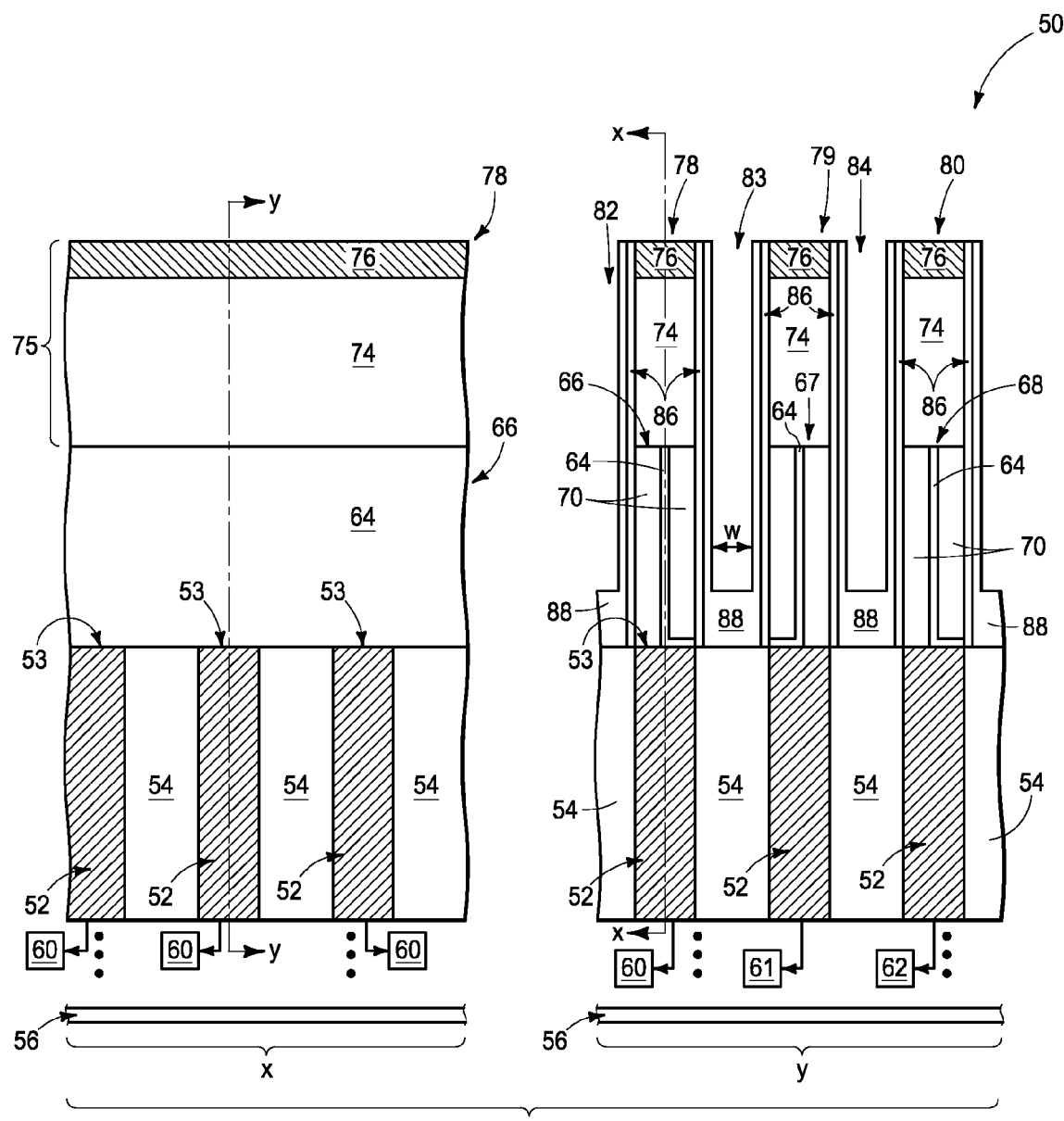

Referring to FIG. 7, additional electrically insulative material 88 is provided within trenches 82-84 to narrow the trenches. The additional electrically insulative material may comprise a same composition as electrically insulative material liners 86, or may comprise a different composition relative to liners 86. For instance, in some embodiments liners 86 and additional material 88 may both comprise silicon nitride. As another example, in some embodiments liners 86 may comprise silicon nitride, and additional material 88 may comprise oxide, such as, for example, silicon dioxide, silicon oxynitride, aluminum oxide, etc. If material 88 comprises a same material as liners 86, a single deposition step may be utilized to provide the composition corresponding to liners 86 and material 88.

Regardless of whether the liners and material 88 are a same composition as one another or not, the liners 86 and material 88 may be deposited to completely fill trenches 82-84, and subsequent etching may be conducted to form the illustrated gaps corresponding to the narrowed trenches. In yet other alternative embodiments, multiple depositions/etch sequences may be utilized to form the gaps to have a desired cross-sectional profile.

The material 88 and liners 86 may be together considered to be electrically insulative spacers that narrow trenches 82-84. Such spacers may have a width along the cross-section of FIG. 7 of, for example, from about 3 nanometers to about 10 nanometers. The gaps within the narrowed trenches may have any suitable dimensions, and in some embodiments may have widths "W" within a range of from about 1 nm to about 50 nm; such as, for example, a range of from about 3 nm to about 10 nm. The gaps may have any suitable depths. Ultimately, heat shield material (described below with reference to FIG. 8) is formed within the gaps, and it can be desired that the gaps extend to a depth beneath the lowestmost surface of phase change material 74 so that the heat shields vertically overlap an entirety of the phase change material 74. However, in other embodiments the gaps may extend to a depth of less than the depth of the lowestmost surface of phase change material 74, and the heat shield material may vertically overlap only some of the phase change material 74 if it is found that such overlap is sufficient to alleviate or preclude the problematic thermal crosstalk described in the "Background" section.

Figure 8:
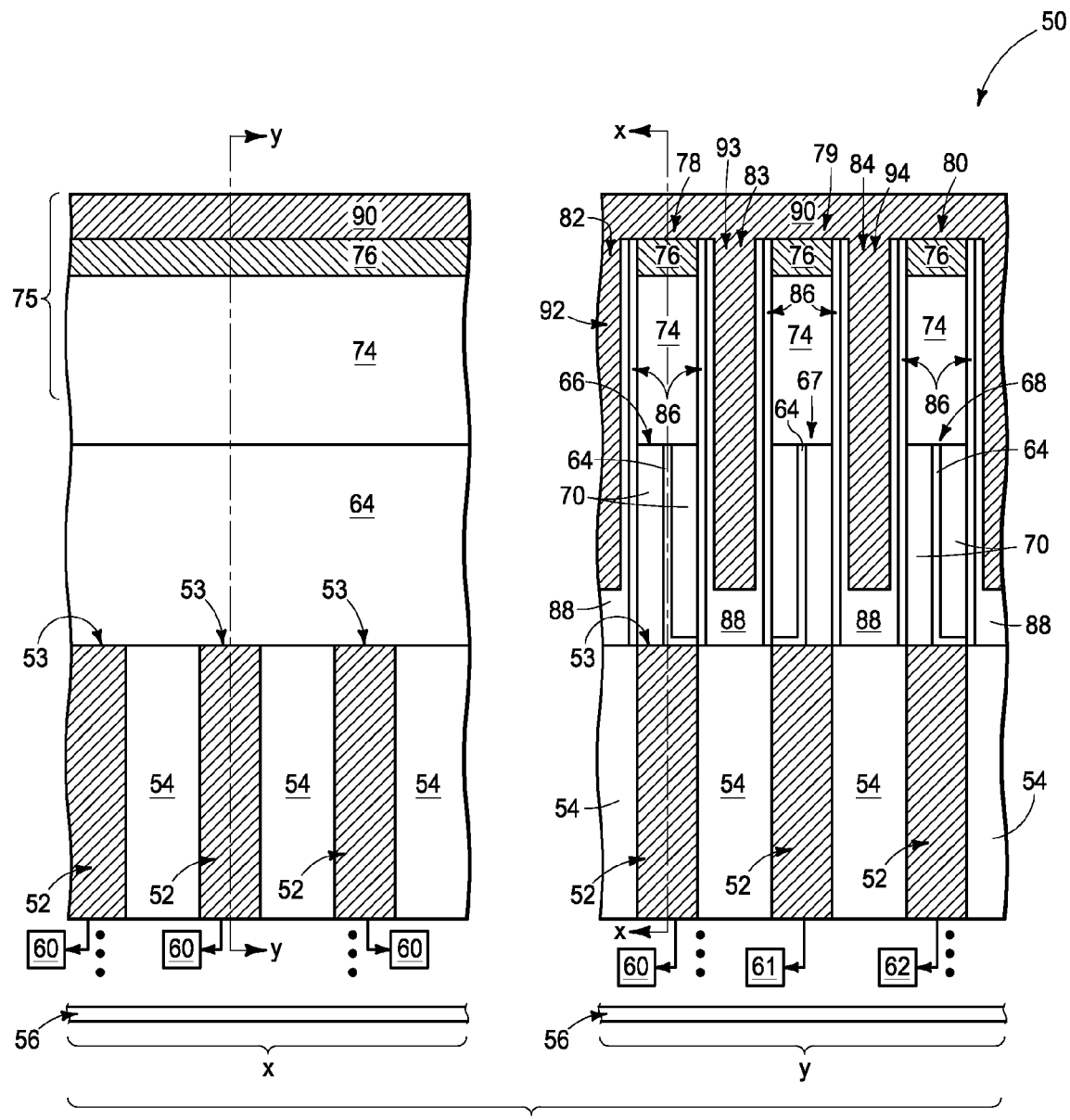

Referring to FIG. 8, the trenches 82-84 are filled with electrically conductive heat shield material 90. Such heat shield material may comprise any suitable composition or combination of compositions; and in some embodiments may comprise metal (tungsten, titanium, tantalum, etc.) or metal-containing compositions (for instance, metal silicide, metal nitride, metal carbide, etc.). In some example embodiments, heat shield material 90 may comprise, consist essentially of, or consist of one or more of tungsten, tantalum, titanium and titanium nitride. In some embodiments, the heat shield material may have a thermal conductivity of at least about 5 watts/(meter·kelvin). The heat shield material 90 within trenches 82-84 may have a width along the cross-section of FIG. 8 of, for example, from about 1 nm to about 50 nm; such as, for example, a range of from about 3 nanometers to about 10 nanometers.

In the shown embodiment, the heat shield material 90 extends across upper surfaces of electrically conductive capping material 76, as well as within trenches 82-84. The heat shield material within trenches 82-84 forms lines 92-94 that extend along the row direction (i.e., that extend along the x-direction of FIG. 8).

Figure 9:
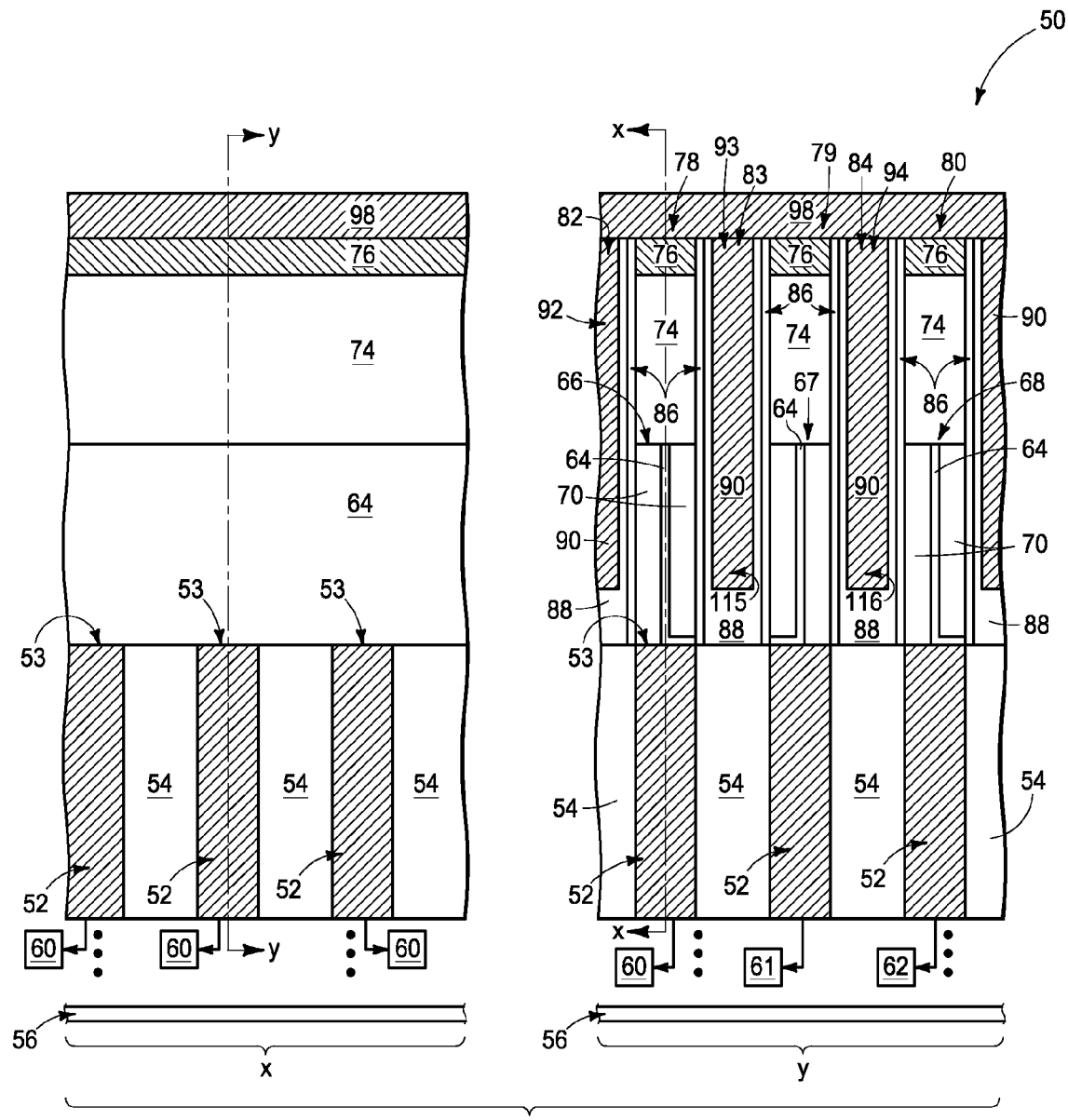
FIG. 9 is a diagrammatic cross-sectional view of regions of a semiconductor construction in accordance with an example embodiment that may follow that of FIG. 8.

Ultimately, the electrically conductive heat shield material 90 within trenches 82-84 will be connected to bitlines. In some embodiments, it can be desired to pattern the heat shield across upper surfaces of capping material 76 into regions of the bitlines. In other embodiments, it may be desired to remove material 90 from over upper surfaces of capping material 76 and to replace it with another material utilized in the bitlines. For instance, FIG. 9 shows an embodiment that may follow that of FIG. 8 in which heat shield material 90 is removed from over upper surfaces of capping material 76 through planarization (for instance, CMP), and then replaced with a different material 98. Material 98 may comprise any composition, or combination of compositions, suitable for being utilized in bitlines.

In some embodiments, constructions similar to that of FIG. 9 may be formed by only partially filling trenches 82-84 with material 90, and then depositing material 98 to fill remaining upper regions of the trenches as well as to extend across capping material 76.

In some embodiments, the construction of FIG. 8 may be preferred over that of FIG. 9, in that it may simplify processing to use the same material 90 for heat shields as well as for regions of bitlines. In other embodiments, the construction of FIG. 9 may be preferred in that the utilization of a different material within the heat shields than within the bitlines may enable a memory array to be tailored for a specific application.

In some embodiments, processing analogous to that described with reference to FIG. 9 may utilize multiple different electrically conductive materials deposited one atop another in trenches 82-84 for incorporation into heat shields, which may enable more specific tailoring of the heat shields for particular applications.

Figure 10:
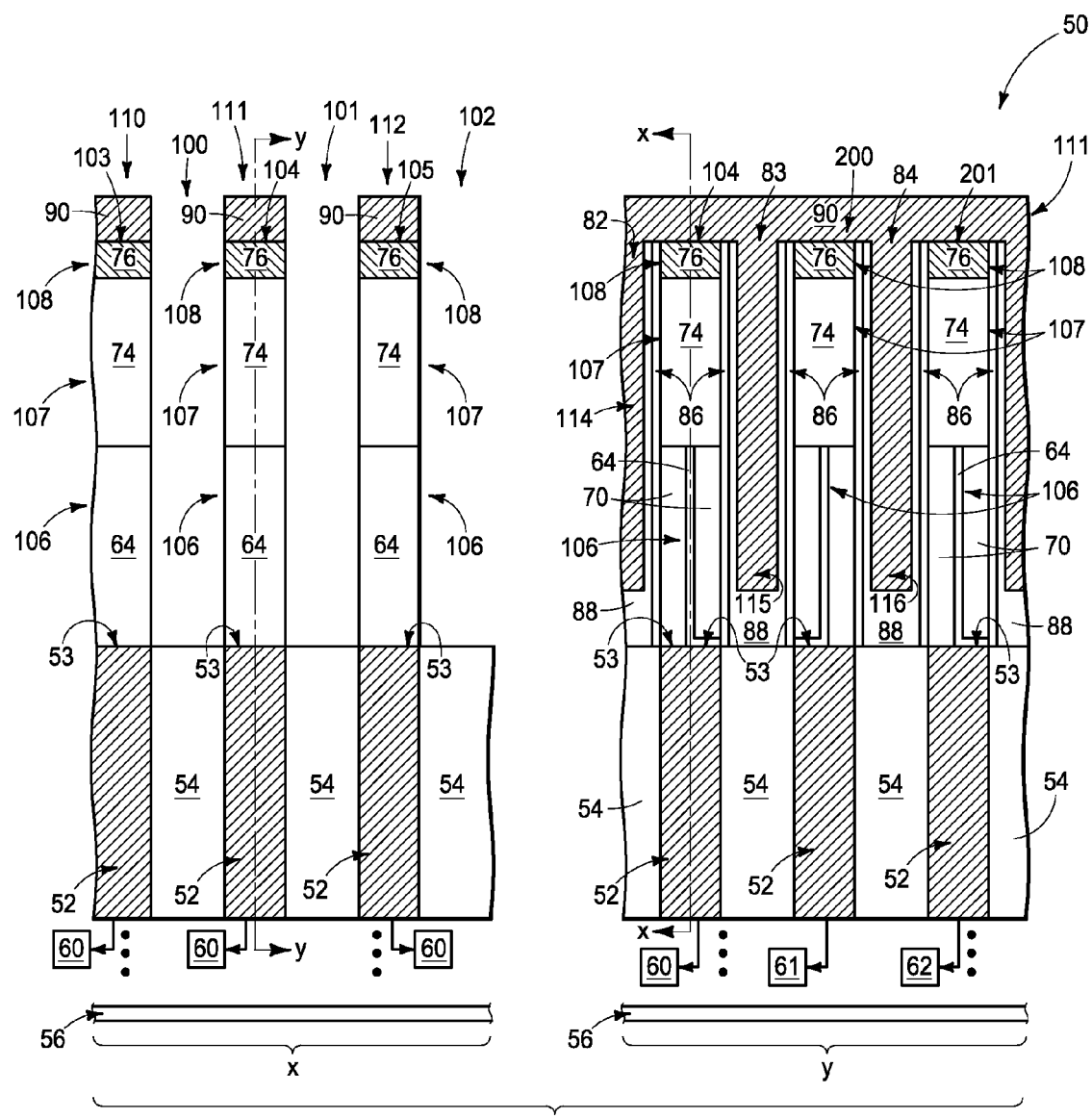
FIGS. 10 and 11 are diagrammatic cross-sectional view of regions of a semiconductor construction in accordance with an example embodiment process of forming an example embodiment memory array; with the processing stage of FIG. 10 following that of FIG. 8.

Regardless of whether embodiments of the type shown in FIG. 8 are utilized, or those shown in FIG. 9 are utilized, subsequent processing slices through the heater material strips 66-68, the phase change material bands 78-80, and the heat shield material lines 92-94 to pattern heaters from the strips, memory cells from the bands, and heat shields from the lines. For instance, FIG. 10 shows a processing stage which follows that of FIG. 8. Trenches 100-102 have been formed along the column direction (i.e., the y-direction of FIG. 10), with such trenches passing through heater material 64, phase change material 74, capping material 76, and heat shield material 90. The patterned materials 64, 74, 76 are together configured as a plurality of pillars 103-105 (visible along the x-direction view) and 104, 200 and 201 (visible along the y-direction view); with such pillars extending upwardly from the nodes 53. Each of such pillars comprises a heater 106 formed from heater material 64, a memory cell 107 formed from phase change material 74, and an electrically conductive capping structure 108 formed from capping material 76. The heat shield material 90 is patterned into a plurality of lines 110-112 that extend along the column direction (the y-direction of FIG. 10), and that are spaced from one another along the row direction (the x-direction of FIG. 10). Further, the heat shield material within trenches 82-84 is patterned into heat shields 114-116.

The heaters 106, memory cells 107, and capping structures 108 are on a same array as the nodes 53; and the heat shields 114-116 separate immediately adjacent memory cells from one another along the column direction (i.e., the y-direction of FIG. 10).

Figure 11:
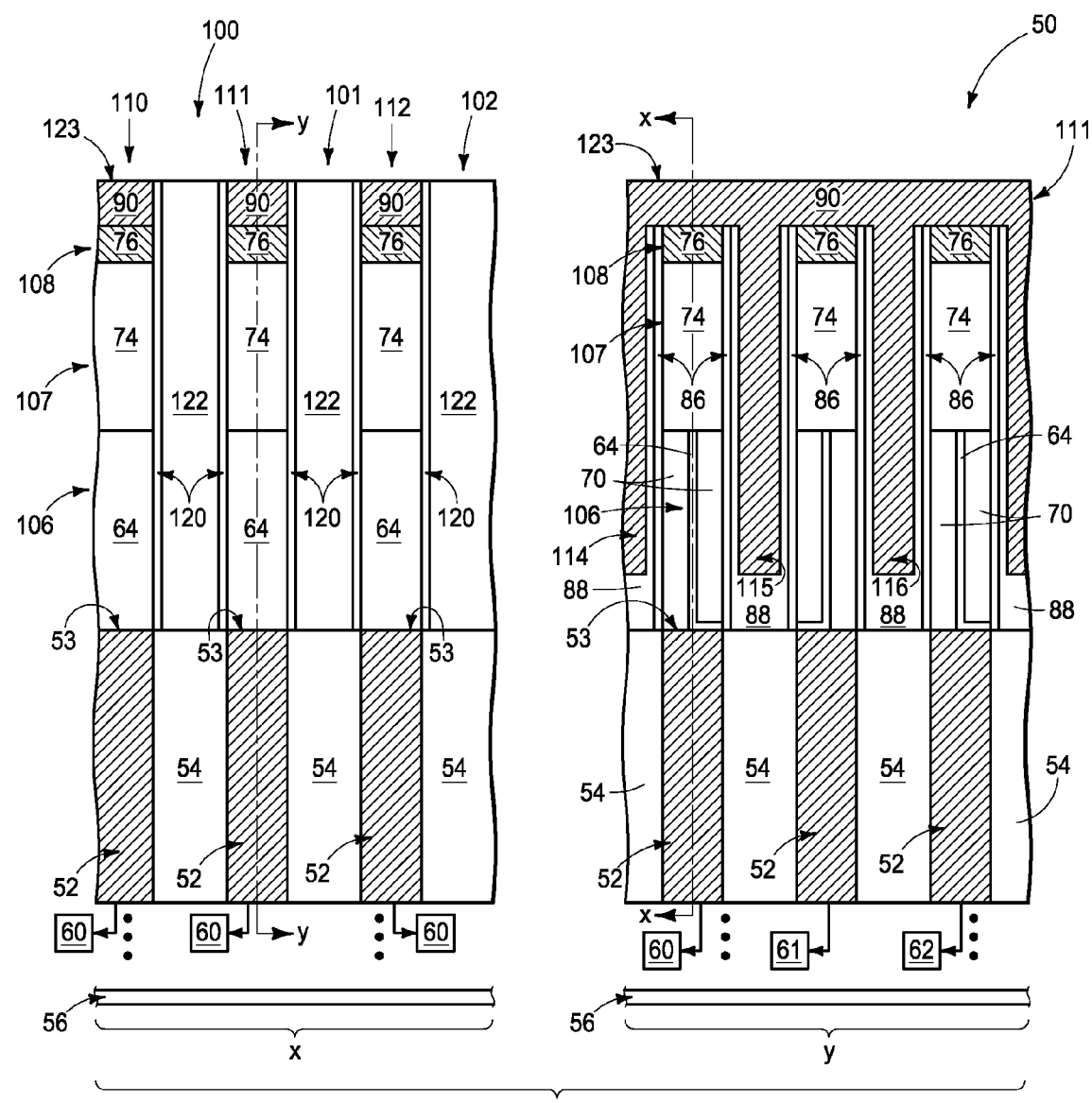

Referring to FIG. 11, trenches 100-102 are filled with electrically insulative materials 120 and 122. In some embodiments, the electrically insulative material 120 may be a non-oxygen containing material (such as, for example, silicon nitride), to avoid oxidation of oxygen-sensitive phase change material 74. Such electrically insulative material may be formed into the illustrated liners along sidewalls of trenches 100-102 by depositing a layer of material 120, followed by an anisotropic etch. The material 122 may comprise any suitable electrically insulative material, including, for example, one or more of silicon nitride, aluminum oxide, silicon oxynitride, silicon dioxide, etc. In some embodiments, trenches 100-102 may be filled with a single homogeneous electrically insulative material, rather than being filled with two or more different materials.

A planarized surface 123 extend across materials 120, 122 and 90. Such surface may be formed with any suitable processing, including, for example, CMP.

Figure 12:
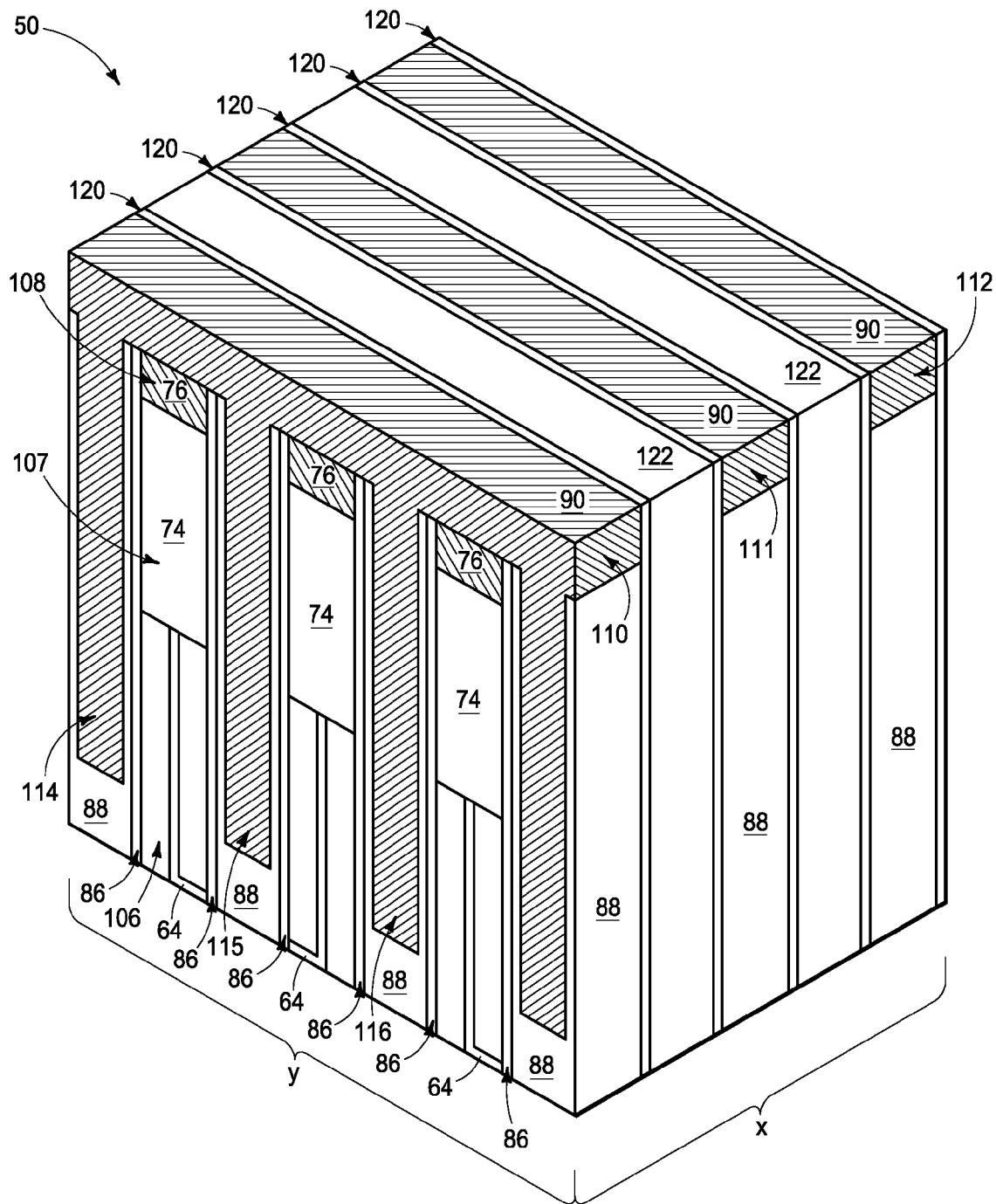
FIG. 12 is a diagrammatic three-dimensional view of the semiconductor construction of FIG. 11.

FIG. 12 shows a three-dimensional view of a portion of a construction at the processing stage of FIG. 11. The illustrated portion comprises the patterned materials above the nodes 53 (FIG. 11).

Figure 13:
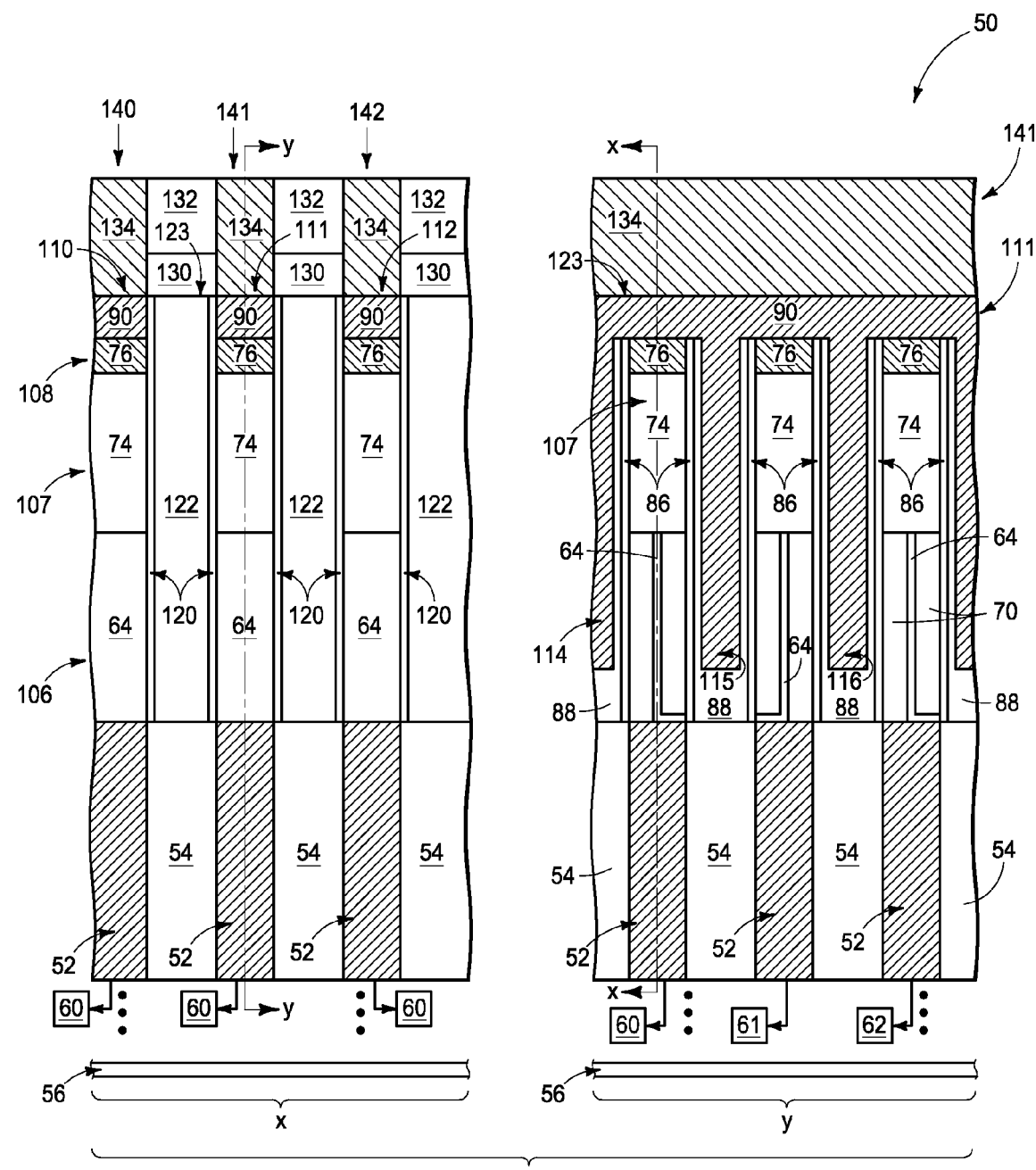
FIG. 13 is a diagrammatic cross-sectional view of regions of a semiconductor construction in accordance with an example embodiment that may follow that of FIG. 11 in some applications.

Referring to FIG. 13, electrically insulative materials 130 and 132 are formed across planarized surface 123, and then bitline material 134 is formed to extend through such electrically insulative materials to electrically connect with material 90 of lines 110-112. The electrically insulative materials 130 and 132 may comprise any suitable composition or combination of compositions; and in some embodiments may correspond to silicon nitride and silicon dioxide, respectively. Although two electrically insulative materials are shown in FIG. 13, in other embodiments the materials 130 and 132 may be replaced with a single material, and in yet other embodiments may be replaced with more than two materials. In some embodiments, at least some of one or both of materials 130 and 132 may be replaced by air gaps.

The bitline material 134 may comprise any suitable composition or combination of compositions. In some embodiments, such material may comprise a copper core surrounded by one or more copper barrier materials (for instance, ruthenium-containing materials). The bitline material 134, together with the lines 110-112 of material 90, forms a plurality of bitlines 140-142 extending along the column direction (i.e., the shown y-direction) of a memory array comprising PCM cells 107.

In the shown embodiment the bitlines 140-142 have lower regions comprising the same material 90 as is utilized in heat shields 114-116. If the embodiment discussed above with reference to FIG. 9 is utilized instead of that of FIG. 8, the bitline material may extend directly against an upper surface of capping material 76, rather than against an upper surface of material 90. However, regardless of which embodiment is utilized, bitline material will be in direct electrical contact with heat shield material of the heat shields 114-116. In some embodiments, the heat shields 114-116 may be considered to project downwardly from the bitline 141.

The direct electrical contact of the heat shields to the bitlines can enhance thermal migration toward colder regions. In any event, the heat shields 114-116 may function as thermal sinks which alleviate thermal crosstalk between adjacent memory cells.

Notably, the heat shields 114-116 are aligned relative to adjacent memory cells through spacer etch methodologies, rather than through utilization of a separate mask to pattern the heat shields. In some aspects, the heat shields may be considered to be self-aligned relative to the adjacent memory cells. The utilization of a process which does not require a separate mask to create the heat shields may enable the heat shields to be readily incorporated into existing fabrication processes.

It is noted that the heaters 106 formed in the methodology of FIGS. 4-13 are shaped as angled plates. Such heaters are provided as an example heater configuration. In other embodiments, other heater configurations may be formed; and in some embodiments the heaters may be omitted and instead heaterless configurations may be formed.

The processing of FIGS. 4-13 forms heat shields between neighboring memory cells along bitline directions (i.e., column directions, and specifically along shown y-directions). In other embodiments, heat shields may be formed between neighboring memory cells along wordline directions (i.e., row directions, and specifically along shown x-directions).

Figure 14:
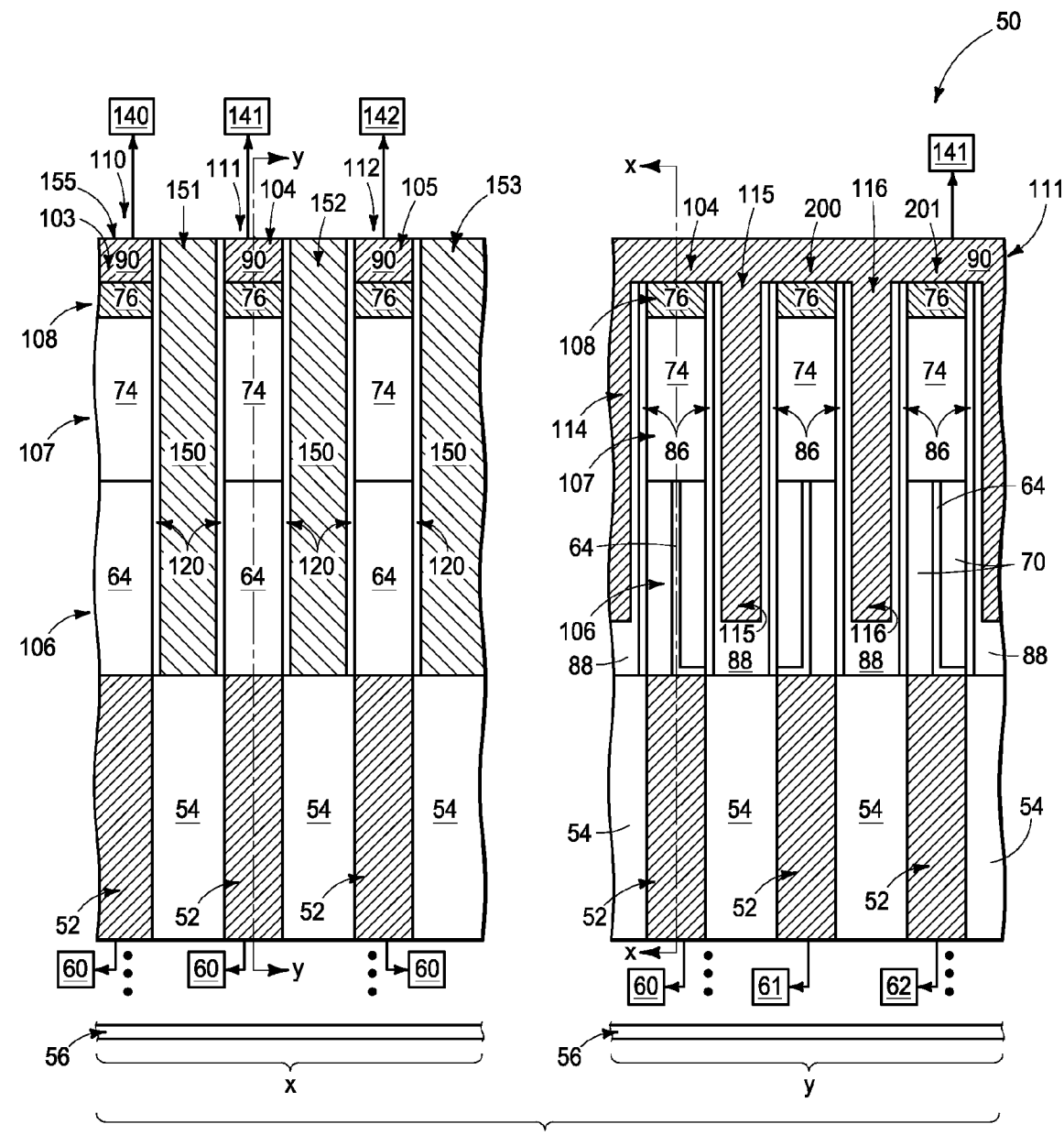
FIG. 14 is a diagrammatic cross-sectional view of regions of a semiconductor construction in accordance with an example embodiment that may follow that of FIG. 11 in some applications.

FIG. 14 shows construction 50 at a processing stage which may follow that of FIG. 10 in accordance with an embodiment in which heat shields are formed between neighboring memory cells along wordline directions. The construction of FIG. 14 comprises electrically insulative spacers 120 lining the trenches 100-102 (FIG. 10), and comprises heat shield material 150 filling the lined trenches. The spacers 120 may be formed in the same way, and of the same material, as the spacers 120 described above with reference to FIG. 11; and accordingly may comprise, consist essentially of, or consist of silicon nitride. In some embodiments, the spacers 120 may comprise two or more different compositions. For instance, the spacers may comprise a laminate of silicon nitride and an oxide; with the silicon nitride being directly along exposed surfaces of materials 64, 74, 76 and 90, and with the oxide being spaced from such surfaces by the silicon nitride. In such embodiments, the oxide may comprise, for example, one or both of silicon dioxide and aluminum oxide. The dielectric material 120 may have a thickness of, for example, from about 3 nanometers to about 10 nanometers.

The heat shield material 150 comprises electrically conductive material; and in some embodiments may comprise metal (for instance, tungsten, tantalum, titanium, etc.), and/or metal-containing compositions (for instance, metal nitride, metal silicide, metal carbide, etc.). In some embodiments, heat shield material 150 may comprise, consist essentially of, or consist of one or more of tungsten, tantalum, titanium and titanium nitride. The heat shield material 150 forms heat shields 151-153 within the trenches 100-102 (FIG. 10), respectively. In some embodiments, heat shield material 150 may be formed to overfill the trenches 100-102; then planarization may be utilized to form the shown planarized upper surface 155 and to electrically isolate heat shields 151-153 from one another. The heat shield material within trenches 100-102 may have a width along the cross-section of FIG. 14 of, for example, from about 3 nanometers to about 10 nanometers.

In some embodiments, the trenches 82-84 of FIG. 7 may be referred to as first trenches, and the heat shield material 90 formed within such trenches may be referred to as first heat shield material. In such embodiments, the trenches 100-102 of FIG. 10 may be referred to as second trenches, and the heat shield material 150 may be referred to as a second heat shield material. The first and second heat shield materials may comprise a same composition as one another, or may comprise different compositions relative to one another.

In some embodiments, the electrically insulative materials 86 and 88 formed within the first trenches 82-84 may be considered together to correspond to first electrically insulative spacers, and the electrically insulative material 120 formed within the second trenches 100-102 may be considered to correspond to second electrically insulative spacers. The first and second electrically insulative spacers may comprise the same composition as one another or different compositions.

In the shown embodiment of FIG. 14, the first heat shields 114-116 extend to a first depth, and the second heat shields 151-153 extend to a second depth which is deeper than the first depth. Specifically, the first heat shields 114-116 extend to a sufficient depth to vertically overlap an entirety of phase change material 74 within the memory cells 107, but the first heat shields do not overlap an entire vertical expanse of the heaters 106. In contrast, the second heat shields extend to sufficient depth to vertically overlap an entire vertical expanse of the heaters 106, as well as the phase change material 74 within memory cells 107. In some embodiments, the first and second heat shields may extend to depths other than those shown.

In some embodiments, it can be desired that both the first and second heat shields vertically overlap an entirety of the phase change material 74 of the memory cells in order to alleviate or prevent thermal crosstalk between neighboring memory cells. In some embodiments, it may be found that thermal crosstalk may be sufficiently alleviated even though one or both of the first and second heat shields does not entirely vertically overlap the phase change material 74 of the memory cells and/or does not entirely vertically overlap the heaters 106.

In processing subsequent to that of FIG. 14, bitlines analogous to those of FIG. 13 may be formed and patterned across the construction of FIG. 14; and the bitlines 140-142 are schematically indicated in FIG. 14.

Figure 15:
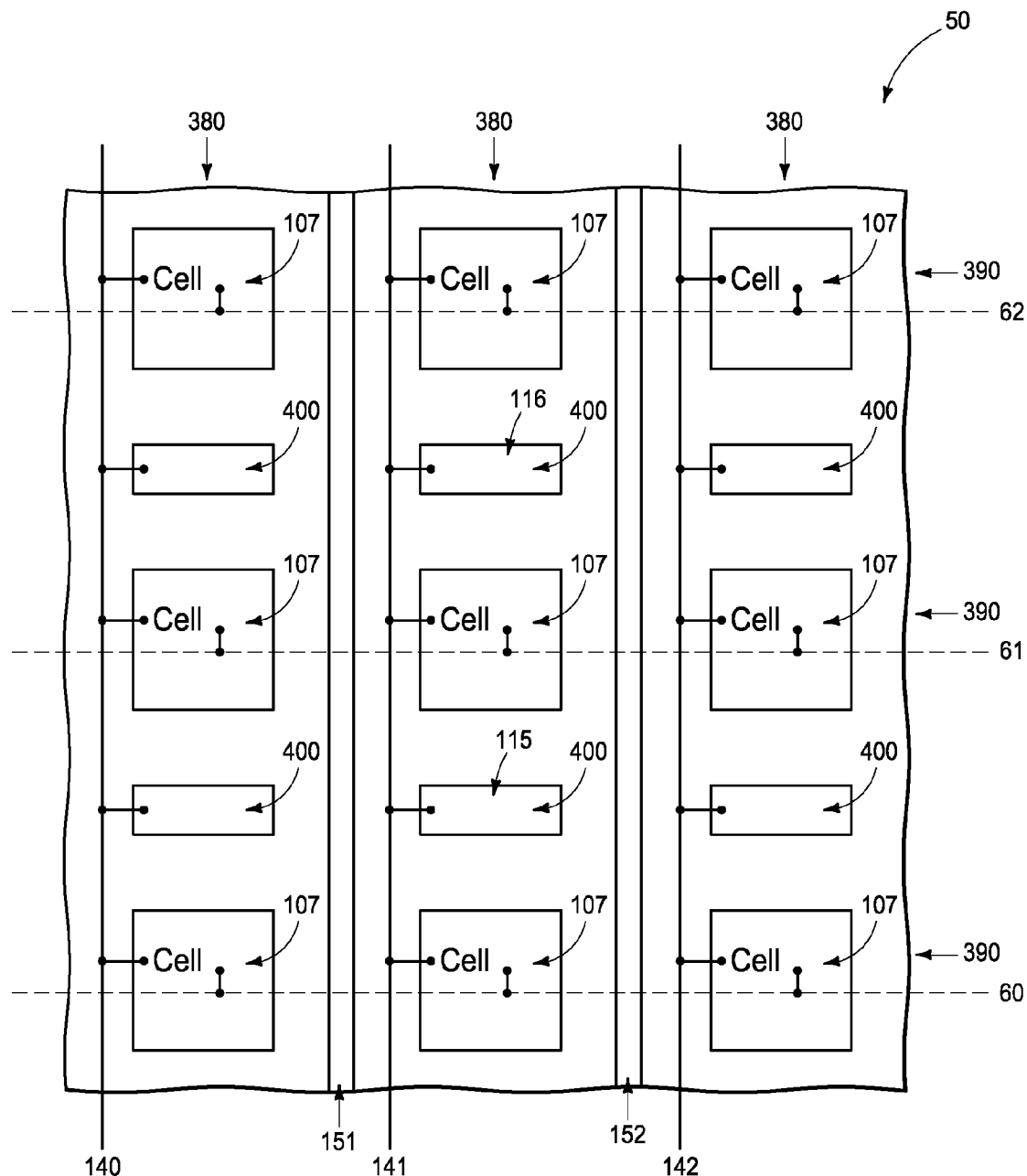
FIG. 15 is a diagrammatic plan view of a region of a memory array comprising structures shown in FIG. 14.

The geometric relationships between the memory cells and the first and second heat shields of FIG. 14 are diagrammatically illustrated with a plan view in FIG. 15. Such plan view shows a plurality of the memory cells 107 arranged in a first grid, with such grid having columns 380 extending along a first direction, and rows 390 extending along a second direction substantially orthogonal to the first direction. Bitlines 140-142 extend along the columns and over the memory cells, while wordlines 60-62 extend along the rows and under the memory cells. The bitlines are shown to be electrically coupled to the memory cells, and similarly the wordlines are shown to be electrically coupled to the memory cells. Each memory cell is uniquely addressed through the combination of a wordline and a bitline.

A plurality of first heat shields 400 are laterally between immediately adjacent memory cells along the columns of the first grid, with heat shields 115 and 116 of FIG. 14 being examples of such first heat shields. Also, second heat shields 151 and 152 are laterally between immediately adjacent memory cells along rows of the first grid. The first heat shields 400 are arranged in a second grid which is offset from the first grid of the memory cells along the column direction, and the second heat shields are lines which extend along the column direction.

In the shown embodiment, the first heat shields 400 are electrically connected to bitlines 140-142, and the second heat shields 151 and 152 are electrically isolated from both the bitlines and the wordlines.

The electronic devices and memory arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory array comprising a plurality of memory cells vertically between bitlines and wordlines. The memory cells comprise phase change material. Heat shields are laterally between immediately adjacent memory cells along a bitline direction. The heat shields comprise electrically conductive material and are electrically connected with the bitlines.

Some embodiments include a memory array comprising a plurality of memory cells arranged in a first grid. The first grid comprises columns along a first direction and comprises rows along a second direction substantially orthogonal to the first direction. The memory cells comprise phase change material. First heat shields are laterally between immediately adjacent memory cells along the first direction of the grid. The first heat shields comprise first electrically conductive material and are arranged in a second grid offset from the first grid along the first direction. Second heat shields are laterally between immediately adjacent memory cells along the second direction of the grid. The second heat shields comprise second electrically conductive material and are arranged lines in lines extending along the first direction.

Some embodiments include a method of forming a memory array. Heater material strips are formed over an array of electrical nodes. The array has a row direction and a column direction substantially orthogonal to the row direction. The nodes are over and electrically coupled with wordlines extending along the row direction. The heater material strips extend across the nodes along the row direction; with the strips being spaced from one another along the column direction. A stack is formed over the strips, with the stack comprising phase change material and electrically conductive capping material. The stack is patterned to form bands in one-to-one correspondence with the strips, with the bands extending along the row direction and being spaced from one another along the column direction. Electrically insulative spacers are formed to extend along sidewall edges of the bands while leaving trenches between the bands. The trenches are filled with electrically conductive heat shield material. The heat shield material within the trenches is configured as lines extending along a same direction as the bands and is laterally spaced from the bands by the spacers. The strips, bands and lines are sliced along the row direction to form memory cells from the bands, heaters from the strips and heat shields from the lines. The heaters and memory cells are on the same array as the nodes. The heat shields separate immediately adjacent memory cells from one another along the column direction. Bitlines are formed over the heat shields and are electrically coupled with the heat shields and the electrically conductive capping material. The bitlines extend along the column direction.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory array comprising:
   a plurality of memory cells vertically between bitlines and wordlines; the memory cells comprising phase change material;
   heat shields laterally between immediately adjacent memory cells along a bitline direction; the heat shields comprising electrically conductive material and being electrically connected with the bitlines; and
   wherein the memory cells are over a semiconductor base, and wherein the heat shields project downwardly from the bitlines to vertically overlap at least some of the phase change material within the memory cells.

2. The memory array of claim 1 wherein the heat shields vertically overlap an entirety of the phase change material within the memory cells.

3. A memory array comprising:
   a plurality of memory cells vertically between bitlines and wordlines; the memory cells comprising phase change material;
   heat shields laterally between immediately adjacent memory cells along a bitline direction; the heat shields comprising electrically conductive material and being electrically connected with the bitlines; and
   wherein the heat shields are first heat shields comprising first electrically conductive heat shield material, and wherein second heat shields are laterally between immediately adjacent memory cells along a wordline direction; the second heat shields being electrically isolated from the bitlines and comprising second electrically conductive heat shield material.

4. The memory array of claim 3 wherein the first and second electrically conductive heat shield materials comprise metal.

5. The memory array of claim 3 wherein the first and second electrically conductive heat shield materials are a same composition.

6. The memory array of claim 3 wherein the first and second heat electrically conductive shield materials are different compositions relative to one another.

7. A memory array comprising:
   a plurality of memory cells arranged in a first grid; the first grid comprising columns along a first direction and comprising rows along a second direction substantially orthogonal to the first direction; the memory cells comprising phase change material;
   first heat shields laterally between immediately adjacent memory cells along the first direction of the grid; the first heat shields comprising first electrically conductive material and being arranged in a second grid offset from the first grid along the first direction;
   second heat shields laterally between immediately adjacent memory cells along the second direction of the grid; the second heat shields comprising second electrically conductive material and being arranged lines in lines extending along the first direction; and
   wherein wordlines are under the memory cells and extend along the second direction, wherein bitlines are over the memory cells and extend along the first direction; wherein the first heat shields are electrically coupled to the bitlines; and wherein the second heat shields are electrically isolated from the wordlines and bitlines.

8. A memory array comprising:
   a plurality of memory cells arranged in a first grid; the first grid comprising columns along a first direction and comprising rows along a second direction substantially orthogonal to the first direction; the memory cells comprising phase change material;
   first heat shields laterally between immediately adjacent memory cells along the first direction of the grid; the first heat shields comprising first electrically conductive material and being arranged in a second grid offset from the first grid along the first direction;
   second heat shields laterally between immediately adjacent memory cells along the second direction of the grid; the second heat shields comprising second electrically conductive material and being arranged lines in lines extending along the first direction; and
   wherein the memory cells are over a semiconductor base; and wherein the first and second heat shields vertically overlap an entirety of the phase change material of the memory cells.

9. The memory array of claim 8 wherein the second heat shields are vertically longer than the first heat shields.

10. A method of forming a memory array comprising:
    forming heater material strips over an array of electrical nodes; the array having a row direction and a column direction substantially orthogonal to the row direction; the nodes being over and electrically coupled with wordlines extending along the row direction; the heater material strips extending across the nodes along the row direction; with the strips being spaced from one another along the column direction;

forming a stack over the strips, the stack comprising phase change material and electrically conductive capping material;

patterning the stack to form bands in one-to-one correspondence with the strips; the bands extending along the row direction and being spaced from one another along the column direction;

forming electrically insulative spacers to extend along sidewall edges of the bands while leaving trenches between the bands;

filling the trenches with electrically conductive heat shield material; the heat shield material within the trenches being configured as lines extending along a same direction as the bands and being laterally spaced from the bands by the spacers;

slicing the strips, bands and lines along the row direction to form memory cells from the bands, heaters from the strips and heat shields from the lines; the heaters and memory cells being on the same array as the nodes; the heat shields separating immediately adjacent memory cells from one another along the column direction; and forming bitlines over and electrically coupled with the heat shields and the electrically conductive capping material; the bitlines extending along the column direction.

11. The method of claim 10 wherein the heat shield material has a thermal conductivity of at least about 5 watts/(meter·kelvin).

12. The method of claim 10 wherein the heat shield material extends across the electrically conductive capping material after filling of the trenches with the heat shield material; and wherein the heat shield material over such electrically conductive capping material remains as regions of the bitlines after slicing the strips, bands and lines.

13. The method of claim 10 wherein the heat shield material extends across the electrically conductive capping material after filling of the trenches with the heat shield material; and wherein the heat shield material is entirely removed from over such conductive capping material prior to forming the bitlines.

14. The method of claim 10 wherein the electrically insulative spacers comprise one or more of silicon nitride, silicon dioxide and aluminum oxide.

15. The method of claim 10 wherein the heat shield material comprises metal.

16. The method of claim 10 wherein the heat shield material comprises tungsten.

17. The method of claim 10 wherein the heaters are angled plates.

18. The method of claim 10 wherein the trenches between the bands are first trenches, wherein the insulative spacers along the sidewall edges of the bands are first electrically insulative spacers, wherein the heat shield material is first heat shield material, and wherein the slicing the strips, bands and lines occurs through formation of second trenches that extend along the column direction; the method further comprising:

forming second electrically insulative spacers along sidewall edges of the second trenches to narrow the second trenches; and filling the narrowed second trenches with second heat shield material.

19. The method of claim 18 wherein the first heat shield material extends vertically to overlap an entirety of the phase change material, but does not overlap an entire vertical expanse of the heaters; and wherein the second heat shield material extends vertically to overlap an entire vertical expanse of the heaters and the phase change material.

20. The method of claim 18 wherein the second electrically insulative spacers comprise one or more of silicon nitride, silicon dioxide and aluminum oxide.

21. The method of claim 18 wherein the second heat shield material comprises metal.

22. The method of claim 18 wherein the second heat shield material comprises tungsten.

* * * * *